United States Patent [19]
Daniel

[11] 3,715,242
[45] Feb. 6, 1973

[54] METHODS OF MANUFACTURING SEMICONDUCTOR DEVICES

[75] Inventor: Peter James Daniel, Redhill, England

[73] Assignee: U.S. Philips Corporation

[22] Filed: Dec. 21, 1970

[21] Appl. No.: 100,152

[30] Foreign Application Priority Data

Dec. 17, 1969 Great Britain....................61,517/69

[52] U.S. Cl...............148/1.5, 148/187, 250/219 DR
[51] Int. Cl...........................H01l 7/00, G01n 21/30
[58] Field of Search..148/1.5, 187; 318/640; 29/578; 250/201 R, 219 DR, 237 R

[56] References Cited

UNITED STATES PATENTS

| | | | |
|---|---|---|---|
| 3,193,418 | 7/1965 | Cooper et al. | 148/187 |
| 3,326,176 | 1/1967 | Sibley | 148/1.5 |
| 3,497,705 | 2/1970 | Adler | 250/201 |
| 3,569,718 | 3/1971 | Borner | 250/237 R |

OTHER PUBLICATIONS

Brunner, Mask Alignment, IBM Technical Disclosure Bulletin, Vol. 11, No. 12, May 1969, Page 1683.

*Primary Examiner*—Donald L. Walton
*Attorney*—Frank R. Trifari

[57] ABSTRACT

A method of manufacturing a semiconductor device in which a process is effected at a semiconductor surface with the aid of an electron beam. A reference marker of a metal or metal based layer is provided at the semiconductor surface, the secondary electron emission pattern of the marker being used for registration purposes. The reference marker remains substantially inert and adheres to the surface during the process. Where two or more processes are effected at the semiconductor surface, each with the aid of an electron beam, the metal or metal based layer reference marker provides for accurate alignment at each process. The electron beam may be used for the selective exposure of an electron sensitive resist layer or for the selective electron bombardment of a layer of an organic silicon compound which yields an adherent oxide layer pattern on the semiconductor surface and may be used as a mask against impurity diffusion.

18 Claims, 1 Drawing Figure

PATENTED FEB 6 1973
3,715,242
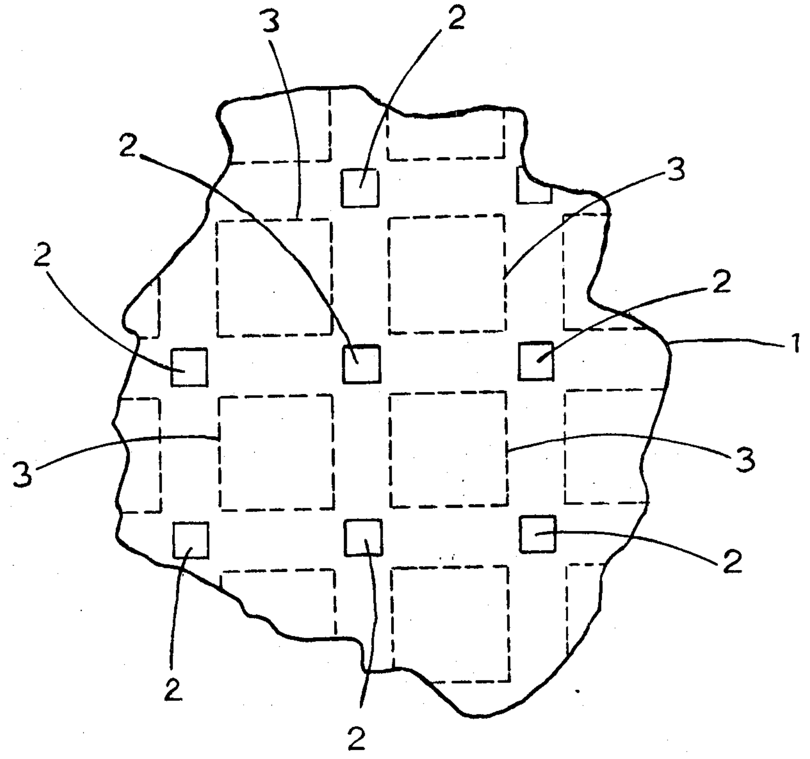
INVENTOR.
PETER J. DANIEL
BY
[signature]
AGENT

METHODS OF MANUFACTURING SEMICONDUCTOR DEVICES

This invention relates to methods of manufacturing semiconductor devices wherein at a surface of a semiconductor body a process is effected with the aid of an electron beam.

Electron beam technology can be applied to semiconductor device manufacture in various ways and its application is becoming of particular importance in the manufacture of planar semiconductor devices, including transistors and semiconductor integrated circuits. It is considered that many of the disadvantages associated with planar processing could be removed by the use of electron beam techniques for various process stages. It has already been suggested to define a pattern in a photoresist layer by means of the selective electron beam irradiation of an electron sensitive resist. The photoresist pattern is then used for defining a pattern in an underlying insulating layer or metal layer. The electron beam generation of the pattern in the resist avoids the use of a photographic mask in contact with the semiconductor body and can provide the formation of very precise openings having very small line widths. One suitable photoresist for this process is the electron sensitive positive resist polymethylmethacrylate (PMMA). Another use of electron beam techniques in planar device manufacture that has been proposed is the formation of an oxide layer pattern on a semiconductor surface by an electron beam initiated chemical reaction. In particular it has been proposed to form an oxide layer pattern on a semiconductor surface by applying a thin film of a solution of an organic silicon compound on the semiconductor surface and exposing the film selectively to electron irradiation. The irradiated parts of the film are changed and become insoluble in certain organic solvents which dissolve the parts of the film which are not irradiated. Heat treatment of the resulting film can yield an oxide material the properties of which, for example the etching rate and masking properties against diffusants, are close to those of oxide layers produced by normal techniques. One such organic silicon compound which has been found to be suitable for yielding an oxide layer pattern on a silicon surface by the electron beam method described is polymethylcyclosiloxane (PMCS).

For planar processing in which a series of diffusion steps are performed at a semiconductor surface, each diffusion step is carried out by introducing an impurity into openings present in an insulating layer on the surface. The openings are normally formed by a photoprocessing and etching method, using a photographic mask for exposure of a photoresist film on the insulating layer surface. Thus a plurality of such masks is required for a plurality of diffusion steps. To obtain a good yield of devices of reasonable quality it is essential that each mask is accurately aligned for the exposure. By use of the described electron beam method of forming an oxide layer pattern it is possible to perform a plurality of diffusion steps using a separately prepared oxide layer pattern for each diffusion step. After a diffusion step the oxide layer pattern used for this diffusion step is removed and a fresh oxide layer pattern generated by the electron beam method. With such a method of planar processing an in any method of manufacturing a semiconductor device in which at least two processes are performed at a surface of a semiconductor body with the aid of an electron beam it is necessary to provide registration means on the semiconductor body for adjusting the position accurately of the electron beam so that a high degree of alignment is achieved. The alignment may be obtained using a reference marker at the semiconductor body surface which can be identified by the electron beam. Hitherto reference markers have been provided in various different forms. In one form diffused regions in the semiconductor body have been used as reference markers. Identification of these marker regions is achieved by observing the secondary electron emission or scattered primary electrons from the marker regions which differs in the areas of the marker regions from the remainder of the surface due to the charging of these regions. This system is not entirely satisfactory because during the processing of the device the extent and characteristics of the diffused marker regions change due to the high temperatures involved and therefore precise alignment for various subsequent stages is difficult to achieve. Another system consists in the use of etched holes in the semiconductor body surface. These can be identified by observing the secondary electron emission pattern but again this is not entirely satisfactory. This is because the edges of the marker holes are not sharply defined in the secondary electron emission or scattered primary electron pattern, a shadow effect being produced due to the source and receiver being relatively displaced. The absence of sharply defined edges makes it very difficult to determine the center of the marker, particularly when using computer control techniques.

It has also been proposed to use as reference markers etched metallic squares on top of a silicon dioxide layer on the semiconductor surface. In this proposal metals with high atomic number and high melting point were suggested as being suitable for both resistance to the processes involved during device fabrication and for providing a high output signal, and as an example silver squares have been suggested. This proposal in theory seems reasonable but in practice is not readily carried into effect because the choice of such metals of high melting point and high atomic number which will adhere sufficiently to the silicon dioxide surface is limited and of those which are known to have a satisfactory adherence to the silicon dioxide few, if any, have the desired degree of resistance to the fabrication processes involved. Silver, the quoted example in the proposal, is not normally suitable where more than one process has to be performed and a second registration step is required because most of the processes, for example, diffusion and oxidation are carried out at temperatures well in excess of the melting point of silver. Of the known metals which have a sufficient adherence to silicon dioxide, aluminum and titanium are too light to give a suitable secondary emission or scattered primary electron signal, chromium cracks and oxidizes at the normally employed processing temperatures and furthermore the oxide of chromium formed is soluble in most etches, molybdenum, tungsten and tantalum are not suitable because they readily oxidize at the normally employed processing temperatures and form volatile oxides, and gold diffuses readily into the silicon through the silicon oxide layer. These metals are the more commonly known metals which can have a suitable adherence to silicon dioxide and it is clear that of these metals the ones of sufficiently high atomic number to give the required secondary emission or scattered primary electron signal, when applied on the silicon dioxide are not suitable as reference markers as they are insufficiently resistant to the normal processing temperatures and this lack of resistance prohibits their further use for registration purposes after such processing.

Thus where a process is to be performed with the aid of an electron beam it is essential to provide at least one reference marker which has sharply defined edges and which remains substantially inert during the process. Where two or more processes are to be performed with the aid of an electron beam it is essential that the marker remains substantially inert with sharply defined edges at least up to the stage of the last process where an alignment operation has to be performed.

According to the invention in a method of manufacturing a semiconductor device wherein at a surface of a semiconductor body a process is effected with the aid of an electron beam, at least one reference marker for identification by the electron beam is provided at said surface prior to commencing the process, the marker comprising a metal based layer which remains substantially inert and adheres to the surface during the process.

In this method various advantages arise compared with the previously described prior art methods and proposals. The provision of a metal based layer reference marker on the semiconductor surface compared with the provision of a metal layer reference marker on the silicon dioxide surface allows a wider choice of materials for the marker because in the processing the marker on the semiconductor surface may be protected from diffusants and oxygen by an overlying oxide layer, such diffusants and oxygen being capable of attacking some of such materials which if provided on the silicon dioxide surface would therefore be unsuitable as reference markers. Furthermore the choice of materials is wider because the requirement of adherence of the metal based layer to the semiconductor surface imposes less of a restriction on the choice of materials than the requirement of adherence of a metal layer to the silicon dioxide surface. Another advantage of providing the reference marker as a metal based layer on the semiconductor surface is that it is possible to remove an oxide layer on the semiconductor surface at an intermediate processing stage without disturbing the marker whereas this is not possible when providing the marker on the surface of the oxide layer. This is particularly important when using the oxide layers produced by electron irradiation of PMCS previously referred to because in general it is the practice to remove the oxide layer at various processing stages and provide fresh oxide layers by this method.

The term "metal based layer" is to be understood to include not only a layer of a metal compound applied directly to the semiconductor surface, for example by sputtering, but also a layer formed by applying a metal layer to the semiconductor surface and the subsequent conversion of the applied metal layer to form an inert compound material. In the latter case the conversion may or may not involve a reaction with the semiconductor material depending upon the choice of metal. When the compound is formed by a reaction between the metal and the semiconductor material this is effected by a heating step. When the compound is formed without a reaction occurring between the metal and the semiconductor, the conversion of the metal to a metal compound may consist in the oxidation of the metal to form a stable and inert oxide.

In one preferred form of the method in which the semiconductor body is of silicon, the metal based layer reference marker is formed by applying one of the metals platinum, palladium or rhodium to the silicon surface and heating to form a compound with the silicon. Of these three metals the preferred one is platinum as this readily forms platinum silicide when heated with silicon. Similarly, palladium forms palladium silicide when heated with silicon. At the temperatures involved in normal semiconductor processing, the silicides of platinum and palladium remain substantially inert and their adherence to silicon is satisfactory. It has been found that the edges of a platinum silicide marker remain sufficiently clearly defined after a high temperature oxidation or diffusion process.

When the metal based layer is formed by heating an applied metal layer to react with the semiconductor body, the choice of the metal is determined to a certain extent by the nature of the processes involved but in general the solubility of the metal in the semiconductor body must be low. Furthermore, in order to prevent undesirable effects on the semiconductor material, the temperature required for the reaction should not be too high. Although in this context platinum is eminently suitable when using a silicon semiconductor body due to its ability to form platinum silicide at an acceptable temperature, the use of metal based layer reference markers formed by heating such metals as molybdenum, tungsten and tantalum in contact with the semiconductor surface is also contemplated provided the silicon material can withstand the high temperatures involved without the occurrence of any undesirable effects which could adversely influence the semiconductor device properties.

A platinum silicide marker may be obtained by forming an oxide layer on the silicon surface, making an opening in the oxide layer, for example by a photoprocessing and etching method, said opening corresponding substantially in area and location to that of the marker to be obtained, depositing platinum in the opening and over the surface of the remaining oxide layer, heating the body to form platinum silicide at the area of the opening by the reaction of the platinum with the underlying silicon and thereafter removing the remaining unreacted platinum on the oxide layer.

The thickness of the platinum silicide marker may be at least 100 Angstrom units, preferably at least 0.5 micron.

As an alternative to forming the metal based layer reference marker by a reaction of a metal with the semiconductor a metal based layer reference marker may be formed by the application of a metal layer to the semiconductor surface and a subsequent heating step in an oxidizing atmosphere to form an inert oxide of the metal, for example the applied metal layer may be of zirconium, and subsequent heating and oxidation effected to form a marker of zirconium oxide. Other possibilities are the application of hafnium or thorium and their subsequent heating and oxidation to form the oxides of these metals.

The metal based layer may be applied directly to the semiconductor surface, for example, a layer of zirconium oxide may be applied by sputtering or a layer of platinum silicide may be applied by sputtering.

In a preferred form of the method in accordance with the invention, the semiconductor body is in the form of a wafer and the processes are carried out to form a plurality of devices, for example transistors or integrated circuits, in the wafer at individual areas of the wafer surface, a plurality of the reference markers being spaced at regular intervals on the semiconductor body surface. Each individual area may be associated with at a plurality of reference markers. However the number of markers provided on the wafer will be determined in accordance with degree of control of the electron beam than can be obtained over a specified area and upon the aberrations of the electron beam.

A process performed with the aid of an electron beam may comprise the generation of a pattern in a film of an electron sensitive resist. The electron sensitive resist may be a positive resist or negative resist.

A process performed with the aid of an electron beam may comprise the generation of an oxide layer pattern on the semiconductor surface by the selective electron bombardment of a film of an organic silicon compound applied to the surface. The compound may be of such a form that the oxide layer parts are formed in the irradiated parts, the non-irradiated parts being removed by a suitable solvent. However, in certain cases it may be preferable to use a compound in which the oxide layer parts are formed in the non-irradiated parts, the irradiated parts being removed with a suitable solvent. In this manner the area of scanning by the electron beam may be relatively small.

After forming the oxide layer pattern an impurity element may be introduced into the parts of the semiconductor surface not covered by the oxide layer parts, and subsequently the oxide layer pattern is removed without removing the marker or markers and a second oxide layer pattern is then generated on the surface by the selective electron bombardment of a film of an organic silicon compound applied to the surface, the reference marker or markers being used for registration purposes in forming the second oxide layer pattern.

The identification of the marker or markers may be achieved by detecting the secondary electron emission or scattered primary electrons therefrom. The detection of the secondary electron emission or scattered primary electrons may be used to adjust both the position and the focus of the electron beam used in carrying out the process.

An embodiment of the invention will now be described, by way of an example, of the application of the method in the manufacture of a silicon planar bipolar transistor, with reference to the accompanying diagrammatic drawing which shows in plan view part of the surface of a silicon disc having a plurality of platinum silicide reference markers thereon at an initial stage in the manufacture.

The starting material is an $n^+$-type silicon substrate of 0.005 ohm-cm. resistivity in the form of a disc of approximately 200 microns thickness and 3.8 cm. diameter. An n-type silicon epitaxial layer of 0.5 ohm-cm. resistivity and 7 microns thickness is grown on a suitably prepared surface of the substrate. The surface of the epitaxial layer is suitably cleaned and thermally oxidized in wet oxygen at 1,000°C for 90 minutes to produce a silicon oxide layer having a thickness of 6,000 A on the surface of the epitaxial layer.

The positive electron sensitive resist polymethylemthacrylate (PMMA) is then spun evenly onto the surface of the oxide layer to produce a film of approximately 6000 A. A baking treatment is then carried out at 100°C for 20 minutes. Using an electron beam machine the resist layer is then selectively exposed to electron bombardment according to a first of a series of five predetermined pattern masks provided on a film strip.

The electron beam machine used in this embodiment comprises means for focussing an electron beam to a sub-micron diameter spot with a current density of 30 Amps/cm$^2$. Two pairs of double deflection coils for x any y scans are mounted within the objective lens of the machine and can be rotated for orientating the pattern with the semiconductor substrate which is mounted on a table which can be moved mechanically. The substrate can be viewed by scanning electron microscopy, the secondary electron or scattered primary electron flux being measured using an Everhert-Thornley arrangement of grids and scintillators connected by a light pipe to a photomultiplier outside the vacuum system of the machine. The output is used to provide a television display that is scanned in synchronism with the electron beam, the scan voltages being derived from resistances in series with the deflection coils of the beam.

The pattern masks on the film strip are read out in synchronism with the beam by a photomultiplier and flying spot scanner system. The output from the photomultiplier actuates a Schmitt trigger set to discriminate between on and off so as to provide the most faithful read out of the mask. This trigger operates a modulator supplying the beam blanking plates of the machine.

After an initial alignment of the semiconductor substrate on the table with the *x* and *y* axes of the mechanical movement the positive electron sensitive resist layer of PMMA is subjected to the electron beam according to the first pattern mask on the film strip. A plurality of rectangular areas of $100\mu \times 100\mu$ and regularly spaced at intervals of 1 mm. are subjected to the electron bombardment. After removal from the table the irradiated areas are dissolved in iso-propyl alcohol. A further baking treatment at 170°C for 20 minutes is then carried out to render the remaining resist layer sufficiently insoluble to the etch subsequently to be used. The removal of the resist in the irradiated areas exposes the underlying silicon oxide layer. Etching in buffered 10 percent hydrofluoric acid is then carried out to form openings in the silicon oxide layer and expose the underlying surface of the silicon epitaxial layer. The remaining parts of the PMMA resist layer are then removed by dissolving in acetone. At this stage of the processing the epitaxial layer has a silicon oxide layer thereon with a plurality of rectangular openings of $100\mu \times 100\mu$ spaced at regular intervals of 1 mm. exposing the silicon surface.

A layer of platinum of 0.5$\mu$ thickness is deposited by evaporation deposition over the entire surface of the oxide layer including the openings therein. The body with the platinum layer thereon is then heated during which the platinum in contact with the silicon in the openings in the oxide layer reacts with the silicon to form platinum silicide. The platinum on the oxide layer remains substantially inert during this treatment and is subsequently removed, without removing the platinum silicide regions, by dissolving with aqua regia. The silicon oxide layer is then removed with buffered 10 percent hydrofluoric acid. At this stage of the processing the silicon body has a plurality of sharply defined rectangular areas of 100$\mu$ × 100$\mu$ of platinum silicide of approximately 0.5$\mu$ thickness on the epitaxial layer surface.

The FIGURE of the drawing shows a plan view of part of the silicon slice 1 having the areas 2 of platinum silicide thereon which are provided to act as reference markers in the electron beam processes to be carried out subsequently. Areas 3 indicated in broken lines show the positions on the silicon surface at which individual transistor assemblies are to be formed subsequently, each of such areas being associated with four of the reference markers located at the four corners of the area. The following description will be given in terms of the manufacture of one such transistor assembly but where processes such as diffusion, masking, etching etc. are referred to it is to be understood that such processes are each carried out simultaneously at all of the indicated areas 3.

The next stage of the processing is to spin polymethylcyclosiloxane (PMCS) on the surface of the epitaxial layer including the platinum silicide markers to provide a film of approximately 6,000 A thickness. The slice is then remounted on the table of the electron beam machine and by use of suitable jigging the approximate alignment of the slice with reference to its former position on the table is maintained.

The second pattern mask on the film strip is now used for selective electron irradiation of the PMCS layer. This mask comprises of a plurality of areas defining the transistor base diffusion windows and also comprises a similar pattern, but in which the marker areas are smaller, as present on the first mask, that is, the pattern used to produce the platinum silicide markers. Registration prior to irradiation according to the second pattern mask is effected as follows:

The silicon disc is positioned mechanically so that one of the device areas 3 is approximately under the beam while the beam is blanked off. An appropriate reduced scan is selected so that only one of the registration marker areas of both the pattern mask and the substrate are scanned by the flying spot and the beam respectively. The platinum silicide marker although covered by the PMCS can be distinguished by scanning electron microscopy while the electron beam is switched on and off according to the pattern signal being read out simultaneously by the flying spot scanner.

The silicon slice can be moved mechanically and the pattern mask electrically until they superimpose correctly. Pairs of markers are selected alternately to check that the orientation and scales coincide.

The PMCS layer is then irradiated according to the second pattern mask. The non-irradiated parts are then dissolved in acetone. The effect of the electron beam bombardment is to convert the irradiated parts into an oxide layer which can act as a diffusant mask.

After developing in acetone a densification treatment of the oxide layer formed is carried out by heating at 1,000°C for 30 minutes in a dry nitrogen atmosphere. At this stage of the processing the silicon slice has the oxide layer produced from the PMCS on the epitaxial layer surface, a plurality of base diffusion windows being present in this oxide layer, the platinum silicide markers remaining on the silicon surface and partially covered with silicon oxide.

A conventional boron diffusion step is then carried out, the deposition being effected at 1,000°C for 7 minutes using a boron nitride source and the drive in being effected at 1,180°C for 35 minutes under dry, wet and dry oxygen conditions to give a sheet resistivity of 100 ohms. per square and a junction depth of 2$\mu$. During this diffusion step the platinum silicide markers remain substantially inert and unchanged in their dimensions.

The oxide layer produced by electron irradiation of the PMCS film is then removed by dissolving in hydrofluoric acid. After this removal of the oxide layer the platinum silicide markers are exposed again. A further film of PMCS is spun on the surface of the epitaxial layer including the platinum silicide markers to form a film having a thickness of 6,000 A. Using the third pattern mask on the film strip a registration step and exposure is carried out exactly as before, using the platinum silicide markers for alignment with corresponding marker areas on the third mask which defines the emitter diffusion window areas. After irradiation the non-irradiated parts are dissolved and the remaining oxide layer densified in the same manner as before. A conventional emitter diffusion is then carried out using a phosphorus oxychloride source. The deposition is carried out at 975°C for a period of 30 minutes and the drive in is carried out at 1,000°C for a total period of 70 minutes under dry, wet and dry oxygen conditions. This gives an n-type emitter region which has a sheet resistivity of 3 ohms. per square and a junction depth of 1,6$\mu$. During this emitter diffusion step the platinum silicide markers remain inert and unaffected by the processing.

The oxide layer is then removed with hydrofluoric acid and another film of PMCS of 6,000 A thickness applied by spinning. Using the fourth pattern mask on the film strip a registration step and exposure is carried out exactly as before, using the platinum silicide markers for alignment with corresponding marker areas on the fourth mask which defines the emitter and base contact window areas. After irradiation the non-irradiated parts are dissolved and the remaining oxide layer which forms the passivating layer on the silicon surface is heated at 900°C for 30 minutes. This shorter period of heating prevents excessive drive in of the phosphorus emitter diffusion concentration. At this stage of the processing the silicon body having the transistor regions formed thereon at each of the areas 3 has an oxide layer thereon with openings exposing the emitter and base regions for contacting purposes. The platinum silicide markers are still present and are partially covered by an oxide layer.

An aluminum layer of 1μ thickness is then deposited on the surface of the oxide layer and in the openings therein. A film of PMCS of 6,000 A thickness is then applied on the surface of the aluminum layer. The slice is then mounted on the table of the electron beam machine and using the fifth pattern mask on the film strip a registration step and exposure is carried out exactly as before, using the platinum silicide marker areas for alignment with corresponding marker areas of the fifth mask which defines the aluminum connection pattern. The non-irradiated parts of the PMCS resist are dissolved in acetone. The remaining PMCS film is then baked at 120°C for 5 minutes in air and the exposed areas of the aluminum layer are removed with phosphoric acid. Finally the remaining PMCS is removed with trichlorethylene. The slice is then subdivided along orthogonal lines between the areas 3 and each transistor unit is mounted and encapsulated in the normal manner.

Many variations are possible within the scope of the invention. Metals other than platinum may be used for providing the metal based layer marker or markers and in some cases the metal based layer may be applied directly to the semiconductor surface without the necessity of performing a heating step to form a compound material with the semiconductor as occurs in the described method of applying platinum to a silicon surface to form a platinum silicide marker.

The pattern generation in an electron sensitive film or layer with the aid of an electron beam may be carried out by means other than those described in the preceding embodiment, for example the scanning of such a film or layer by the electron beam may be computer controlled.

Although in the preceding embodiment given by way of example the manufacture of the transistor includes the steps of forming a plurality of separate oxide layers by the selective electron irradiation of an organic compound, a method in accordance with the invention can be applied in conventional planar processing where the initially formed oxide layer is retained for a plurality of steps. In such a conventional method the electron beam may be used for the exposure of an electron sensitive resist, the oxide layer initially being provided in the normal manner and retained throughout the processing.

What we claim is:

1. A method of manufacturing a semiconductor device comprising the steps of providing a semiconductor body, forming a metal based layer on a major surface of the semiconductor body to serve as a reference marker in a subsequent step, bombarding the metal based layer with an electron beam, and utilizing information derived from the interaction of the electron beam with the metal based layer in order to located the semiconductor body relative to the electron beam.

2. A method as claimed in claim 1, wherein the metal based layer is formed by depositing a layer of metal on the major surface of the semiconductor body and then applying heat to the semiconductor body so that the metal layer reacts with the material of the semiconductor body to form an inert compound.

3. A method as claimed in claim 2, wherein the material of the semiconductor body at the major surface comprises silicon and the metal is selected from the group consisting of platinum, palladium and rhodium.

4. A method as claimed in claim 3, wherein forming the metal based layer includes forming a silicon oxide layer on the major surface of the semiconductor body, forming an opening in the silicon oxide layer, said opening corresponding substantially in area and location to the reference marker, depositing platinum in the opening and over the silicon oxide layer, heating the semiconductor body so that platinum silicide forms at the surface region of the semiconductor body at the opening in the silicon oxide layer, and removing the remaining unreacted platinum on the silicon oxide layer.

5. A method as claimed in claim 4, wherein the thickness of the platinum silicide is at least 100 Angstrom units.

6. A method as claimed in claim 5, wherein the thickness of the platinum silicide layer is at least .5 micron.

7. A method as claimed in claim 1, wherein the metal based layer is formed by depositing a layer of metal on the major surface of the semiconductor body and heating the semiconductor body in an oxidizing atmosphere to form an inert oxide of the metal.

8. A method as claimed in claim 7, wherein the metal is zirconium and the inert oxide of the metal is zirconium oxide.

9. A method as claimed in claim 1, wherein the metal based layer in its final composition is deposited on the major surface of the semiconductor body.

10. A method as claimed in claim 9, wherein the metal based layer is zirconium oxide applied by sputtering.

11. A method as claimed in claim 9, wherein the metal based layer is platinum silicide applied by sputtering.

12. A method as claimed in claim 1, further comprising a step which includes bombarding the major surface with an electron beam to form a mask pattern, said reference marker remaining substantially inert and adhering to the major surface of the semiconductor body during the formation of the mask pattern.

13. A method as claimed in claim 1, wherein the semiconductor body is in the form of a wafer and a plurality of semiconductor are formed in the wafter at individual areas of the wafer surface and wherein there are a plurality of reference markers, said reference markers being spaced at regular intervals on the major surface of the semiconductor body.

14. A method as claimed in claim 1, further comprising depositing a film of an electron sensitive resist on the major surface of the semiconductor body and bombarding the film with an electron beam to form a predetermined pattern in the film.

15. A method as claimed in claim 1, further comprising depositing a film of an organic silicon compound to the major surface of the semiconductor body and bombarding the film with an electron beam to form an oxide layer pattern on the major surface of the semiconductor body.

16. A method as claimed in claim 15, further including the subsequent step of introducing an impurity element into parts of the major surface of the semiconductor body not covered by the oxide layer pattern, removing the oxide layer pattern without removing the reference marker, and repeating the steps of claim 34 to form a second oxide layer pattern.

17. A method as claimed in claim 1, further including the step of focusing the electron beam by using the detected secondary electron emission.

18. A method as claimed in claim 1, wherein the utilized information is obtain by detecting secondary electron emission from the metal based layer.

* * * * *